US012564048B2

(12) United States Patent
Lee

(10) Patent No.: US 12,564,048 B2
(45) Date of Patent: Feb. 24, 2026

(54) ELECTRONIC DEVICES AND METHODS OF MANUFACTURING ELECTRONIC DEVICES

(71) Applicant: Amkor Technology Singapore Holding Pte. Ltd., Singapore (SG)

(72) Inventor: Sang Hyoun Lee, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 680 days.

(21) Appl. No.: 17/882,327

(22) Filed: Aug. 5, 2022

(65) Prior Publication Data

US 2024/0047301 A1     Feb. 8, 2024

(51) Int. Cl.
| | |
|---|---|
| *H01L 23/373* | (2006.01) |
| *H01L 21/48* | (2006.01) |
| *H01L 21/56* | (2006.01) |
| *H01L 23/00* | (2006.01) |
| *H01L 23/31* | (2006.01) |
| *H01L 23/367* | (2006.01) |

(52) U.S. Cl.
CPC ...... *H01L 23/3737* (2013.01); *H01L 21/4882* (2013.01); *H01L 21/561* (2013.01); *H01L 21/563* (2013.01); *H01L 21/565* (2013.01); *H01L 21/568* (2013.01); *H01L 23/3128* (2013.01); *H01L 23/3675* (2013.01); *H01L 24/16* (2013.01); *H01L 24/32* (2013.01); *H01L 24/73* (2013.01); *H01L 24/96* (2013.01); *H01L 2224/16227* (2013.01); *H01L 2224/16238* (2013.01); *H01L 2224/32225* (2013.01); *H01L 2224/73204* (2013.01); *H01L*

*2224/95001* (2013.01); *H01L 2924/1616* (2013.01); *H01L 2924/16195* (2013.01); *H01L 2924/16235* (2013.01); *H01L 2924/1627* (2013.01); *H01L 2924/182* (2013.01); *H01L 2924/351* (2013.01)

(58) Field of Classification Search
None
See application file for complete search history.

(56) References Cited

U.S. PATENT DOCUMENTS

| | | | | |
|---|---|---|---|---|
| 6,201,301 B1 * | 3/2001 | Hoang | ............... | H01L 21/563 |
| | | | | 257/737 |
| 6,963,141 B2 * | 11/2005 | Lee | ........................ | H01L 24/97 |
| | | | | 257/796 |
| 7,960,827 B1 * | 6/2011 | Miller, Jr. | ........... | H01L 25/0657 |
| | | | | 257/E23.08 |
| 10,504,827 B2 | 12/2019 | Baloglu et al. | | |

* cited by examiner

*Primary Examiner* — Jay C Chang
(74) *Attorney, Agent, or Firm* — Spectrum IP Law Group LLC

(57) ABSTRACT

In one example, an electronic device, comprises a substrate comprising a dielectric structure and a conductive structure, an electronic component over a top side of the substrate, wherein the electronic component is coupled with the conductive structure; an encapsulant over the top side of the substrate and contacting a lateral side of the electronic component, wherein the encapsulant comprises a first trench on a top side of the encapsulant adjacent to the electronic component, a lid over the top side of the encapsulant and covering the electronic component; and an interface material between the top side of the encapsulant and the lid, and in the first trench. Other examples and related methods are also disclosed herein.

18 Claims, 11 Drawing Sheets

ELECTRONIC DEVICES AND METHODS OF MANUFACTURING ELECTRONIC DEVICES

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figures 1A, 1B:
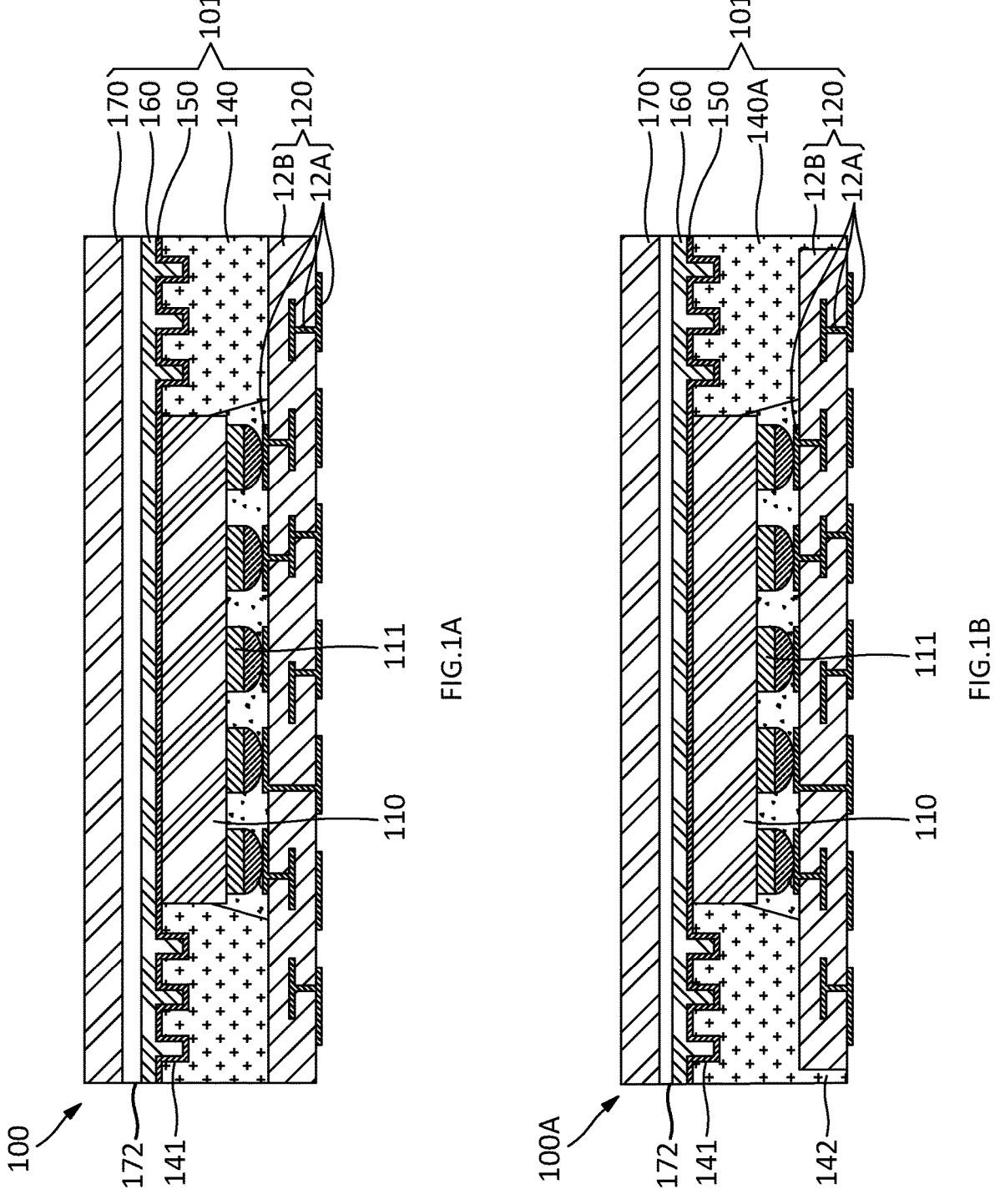
FIGS. 1A and 1B show cross-sectional views of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g.," are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. Similarly, the terms "over" or "on" may be used to describe two elements directly contacting each other or describe two elements indirectly coupled by one or more other elements.

DESCRIPTION

In one example, an electronic device comprises a substrate comprising a dielectric structure and a conductive structure, an electronic component over a top side of the substrate, wherein the electronic component is coupled with the conductive structure, an encapsulant over the top side of the substrate and contacting a lateral side of the electronic component, wherein the encapsulant comprises a first trench on a top side of the encapsulant adjacent to the electronic component, a lid over the top side of the encapsulant and covering the electronic component; and an interface material between the top side of the encapsulant and the lid, and in the first trench.

In another example, an electronic device comprises a substrate comprising a dielectric structure and a conductive structure, an electronic component over a top side of the substrate, wherein the electronic component is coupled with the conductive structure, an encapsulant over the top side of the substrate and contacting a lateral side of the electronic component, a lid over the top side of the encapsulant and covering the electronic component, a metallic interface between the top side of the encapsulant and the lid, and a backside metallization layer between the top side of the encapsulant and the metallic interface.

In a further example, a method manufacturing an electronic device, comprises providing a substrate comprising a dielectric structure and a conductive structure, providing an electronic component over a top side of the substrate and coupled with the conductive structure, providing an encapsulant over the top side of the substrate and contacting a lateral side of the electronic component, providing a trench on a top side of the encapsulant adjacent to the electronic component, providing an interface material over the top side of the encapsulant and in the trench; and providing a lid over the top side of the encapsulant and covering the electronic component, wherein the interface material is between the top side of the encapsulant and the lid.

Other examples are included in the present disclosure. Such examples may be found in the figures, in the claims, or in the description of the present disclosure.

FIG. 1A and FIG. 1B show a cross-sectional views of example electronic devices 100 and 100A. In the example shown in FIG. 1A and FIG. 1B, electronic devices 100 and 100A can comprise electronic component 110, substrate 120, encapsulants 140 and 140A, metallization layer 150, metallic interface 160, and lid 170.

Substrate 120 can comprise dielectric structure 12B and conductive structure 12A. Electronic components 110 can be over a top side of substrate 120 and can comprise connectors 111, and electronic components 110 can be coupled with conductive structure 12A. Encapsulants 140 and 140A can be over the top side of substrate 120 and can contact a lateral side of electronic components 110. Encapsulants 140 and 140A can comprise trenches 141. Encapsulant 140A can comprise skirt 142 contacting a lateral side of substrate 120. Lid 170 can be over the top side of encapsulants 140 or 140A and can cover electronic components 110. Metallic interface 160 can be between the top side of encapsulant 140 or 140A and lid 170. Metallization layer 150 can be referred to as a backside metallization layer 150 and can be between the top side of encapsulants 140 or 140A and metallic interface 160. In some examples, encapsulants 140 or 140A can comprise one or more trenches 141 on the top side of encapsulants 140 or 140A adjacent to electronic components 110. In some examples, interface material 160 or metallization layer 150 can be in one or more of trenches 141. In some examples, interface material 160 can comprise a metallic interface 160, or in other examples interface material 160 can comprise a non-metallic interface or non-metallic material such as an organic compound, an inorganic compound, a polymer, a thermally conductive filler, or a thermal interface material (TIM), and the scope of the disclosed subject matter is not limited in this respect. In some examples, interface material 160 can completely cover the top side of encapsulant 140 or 140A. In some examples, lid 170 optionally can include a backside metallization 172. In such examples, backside metallization 172 can provide enhanced wetting with metallic interface 160 and can comprise a metal such as gold (Au) or a similar material. In some examples, lid 170 can be pre-formed or pre-fabricated with backside metallization 172. It should be noted that that backside metallization 172 is optional wherein lid 170 can also be free of any backside metallization 172, and the scope of the disclosed subject matter is not limited in this respect.

Substrate 120, encapsulants 140 and 140A, metallization layer 150, metallic Interface 160 and lid 170 can comprise or be referred to as electronic package 101 or package 101. Electronic package 101 can protect electronic component 110 from external elements or environmental exposure. Electronic package 101 can provide electrical coupling between external components or other electronic packages and electronic components 110.

Figures 2A, 2B:
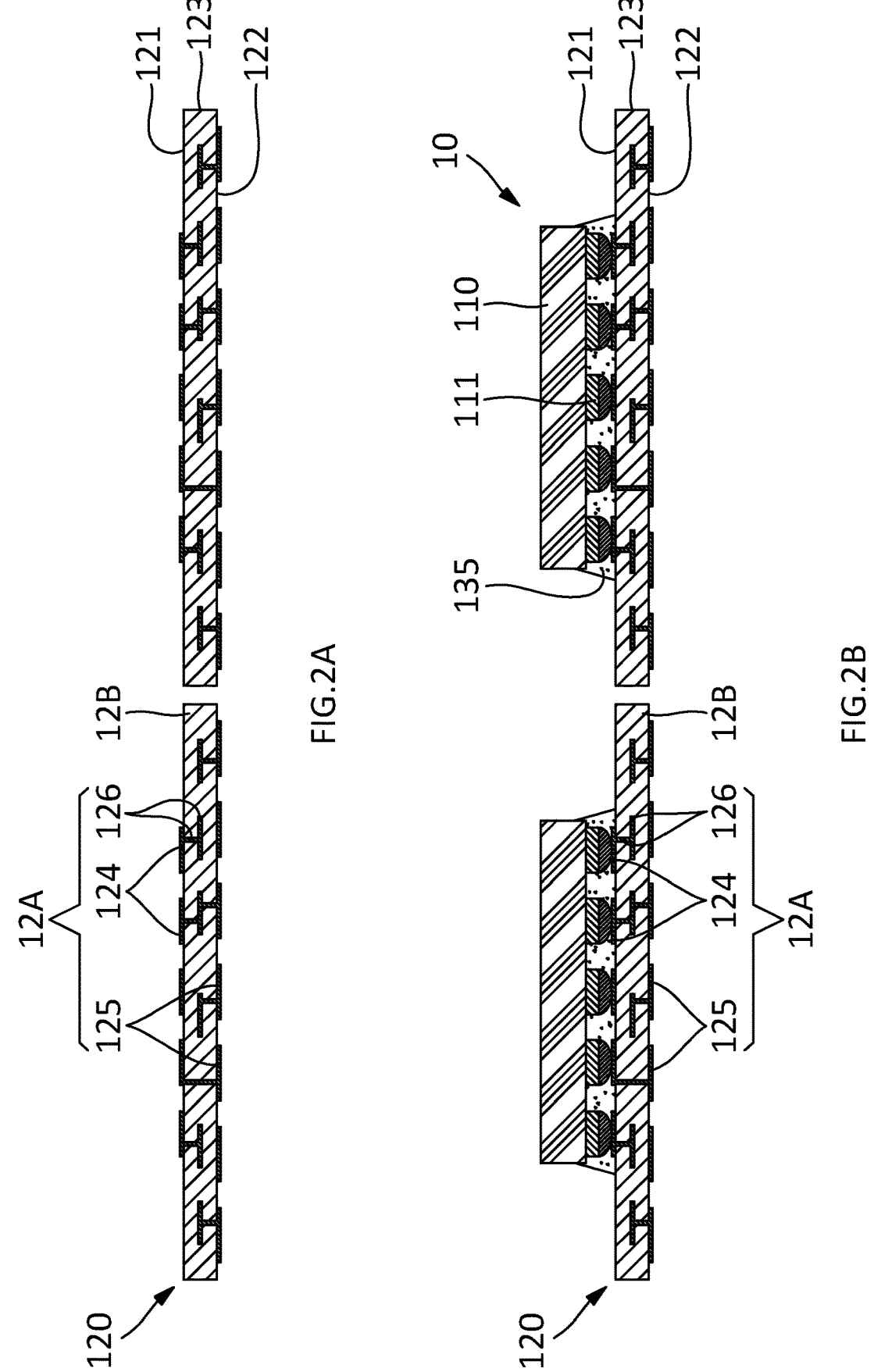
FIGS. 2A to 2H show cross-sectional views of an example method for manufacturing an example electronic device.

FIGS. 2A to 2J show cross-sectional views of an example method for manufacturing example electronic devices 100 and 100A. FIG. 2A shows a cross-sectional view of electronic devices 100 and 100A at an early stage of manufacture. In the example shown in FIG. 2A, substrate 120 can comprise dielectric structure 12B and conductive structure 12A.

In some examples, dielectric structure 12B can comprise or be referred to as one or more dielectric layers. For instance, the one or more dielectric layers can comprise, one or more core layers, polymer layers, pre-impregnated (pre-preg) layers, or solder mask layers stacked on each other. One or more layers or elements of conductive structure 12A can be interposed or embedded between the one or more layers of dielectric structure 12B. The upper and lower sides of dielectric structure 12B can be part of substrate inner side 121 and substrate outer side 122 of substrate 120, respectively. Substrate outer side 122 can be opposite to the substrate inner side 121. Substrate 120 can have substrate lateral sides 123 connecting substrate inner side 121 and substrate outer side 122. In some examples, dielectric structure 12B can comprise an epoxy resin, a phenolic resin, a glass epoxy, a polyimide, a polyester, an epoxy molding compound, or a ceramic. In some examples, the thickness of dielectric structure 12B can range from approximately 20 micrometers (μm) to 500 μm.

Conductive structure 12A can comprise one or more conductive layers and can define conductive paths with elements such as traces, pads, vias, and wiring patterns. Conductive structure 12A can comprise inward terminal 124 provided on substrate inner side 121 of substrate 120, outward terminal 125 provided on substrate outer side 122 of substrate 120, and conductive path 126 extending through dielectric structure 12B.

Inward terminal 124 and outward terminal 125 can be respectively provided on substrate inner side 121 and substrate outer side 122 in a matrix form having rows or columns, respectively. In some examples, inward terminal 124 or outward terminal 125 can comprise or be referred to as a conductor, a conductive material, a substrate land, a conductive land, a substrate pad, a wiring pad, a connection pad, a micro pad, or under-bump-metallurgy (UBM). In some examples, the thicknesses of inward terminal 124 or outward terminal 125 can range from approximately 1 μm to 50 μm.

Conductive path 126 can be formed in dielectric structure 12B to couple inward terminal 124 with outward terminal 125. Conductive path 12A can be formed of one or more conductive layers. In some examples, conductive path 126 can comprise or be referred to as one or more conductors, conductive material, vias, circuit patterns, traces, or wiring patterns. In some examples, inward terminal 124, outward terminal 125, and conductive path 126 can comprise copper, iron, nickel, gold, silver, palladium, or tin.

In some examples, substrate 120 can comprise or be referred to as a rigid substrate, a flexible laminate substrate, a ceramic substrate, a glass substrate, a silicon substrate, a printed circuit board, a multilayer substrate, a laminate substrate, or a molded lead frame. In some examples, substrate 120 can comprise or be referred to as a redistribution layer (RDL) substrate, a buildup substrate, or a coreless substrate. In some example, substrate 120 can have an area varying according to the area of electronic component 110 and can have an area of about 3 millimeters (mm)×3 mm to about 110 mm×110 mm. Substrate 120 can have a thickness of about 0.1 mm to about 7 mm.

In some examples, substrate 120 can be a redistribution layer (RDL) substrate. RDL substrates can comprise one or more conductive redistribution layers and one or more dielectric layers and (a) can be formed layer by layer over an electronic device to where the RDL substrate is to be coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process, or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of one or more inorganic dielectric layers can comprise silicon nitride (Si3N4), silicon oxide (SiO2), or silicon oxynitride (SiON). The one or more inorganic dielectric layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Other substrates in this disclosure can also comprise an RDL substrate.

In some examples, substrate 120 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate and omits the permanent core structure, and the dielectric and conductive layers can be formed on a sacrificial carrier and is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

FIG. 2B shows a cross-sectional view of electronic devices 100 and 100A at a later stage of manufacture. In the example shown in FIG. 2B, one or more electronic component 110 can be provided on substrate 120, coupled inward terminal 124.

In some examples, pick-and-place equipment can pick up electronic component 110 and place it on inner side 121 of substrate 120. In some examples, electronic component 110 can be coupled or secured to inward terminal 124 of substrate 120 through a mass reflow, thermal compression, or laser assisted bonding. In some examples, electronic component 110 can be coupled to inward terminal 124 through wirebonding. In some examples, electronic component 110 can comprise or be referred to as one or more semiconductor dies, semiconductor chips, or semiconductor packages. In some examples, electronic component 110 can comprise one or more passive components, antenna patches, or integrated passive devices (IPDs).

Electronic component 110 can comprise component interconnects 111. Component interconnects 111 can be provided spaced apart from each other in row or column directions. In some examples, component interconnect 111 can comprise or be referred to as a pad, a bump, a pillar, a conductive post, or a solder ball. In some examples, electronic component can be flipped, and component interconnects 111 can comprise wirebonds. Component interconnects 111 can comprise a conductive material such as aluminum, copper, aluminum alloy, or a copper alloy. Component interconnects 111 can be input/output terminals or power terminals of electronic component 110.

Component interconnects 111 can comprise a low-melting-point material and can be coupled to inward terminal 124 of substrate 120. As an example, the low-melting-point material can comprise one or more of Sn, Ag, Pb, Cu, Sn—Pb, Sn37-Pb, Sn95-Pb, Sn—Pb—Ag, Sn—Cu, Sn—Ag, Sn—Au, Sn—Bi, or Sn—Ag—Cu. Component interconnect 111 of electronic component 110 and inward terminal 124 of substrate 120 can be coupled to each other by the low-melting-point material. In some examples, the overall thickness of electronic component 110 can range from approximately 50 μm to 800 μm, or the area can range from approximately 0.5 mm×0.5 mm to about 70 mm×70 mm. In some examples, the width or height of component interconnects 111 can range from approximately 20 μm to 200 μm and pitch can range from approximately 40 μm to 400 μm.

In some examples, interface material 135 can be positioned between electronic component 110 and substrate 120. Interface material 135 can comprise or be referred to as a dielectric layer or a non-conductive paste and can be an inorganic-filler-free resin. In some examples, interface material 135 can comprise or be referred to as CUF, NCP, NCF, or ACF. In some examples, when electronic devices 100 and 100A comprise molded underfill (MUF), interface material 135 can be considered part of encapsulant 140.

In some examples, after electronic component 110 is coupled to substrate 120, interface material 135 can be inserted into a gap between electronic component 110 and substrate 120 and then cured. In some examples, after interface material 135 is dispensed to cover substrate inward terminal 124 of substrate 120, component terminal 111 of electronic component 110 and a low-melting-point material penetrate through interface material 135 and can be coupled to inward terminal 124 of substrate 120. Interface material 135 can prevent electronic component 110 from being separated from substrate 120 against physical impact or chemical impact.

Although electronic component is shown coupled to internal terminals 124 face-down or in a flip-chip configuration, there can be examples where electronic component 110 can be coupled to internal terminals 124 face-up or in a wire-bond configuration. A configuration where substrate 120 and electronic component 110 are combined can be referred to as electronic component unit 10.

Figures 2C, 2D:
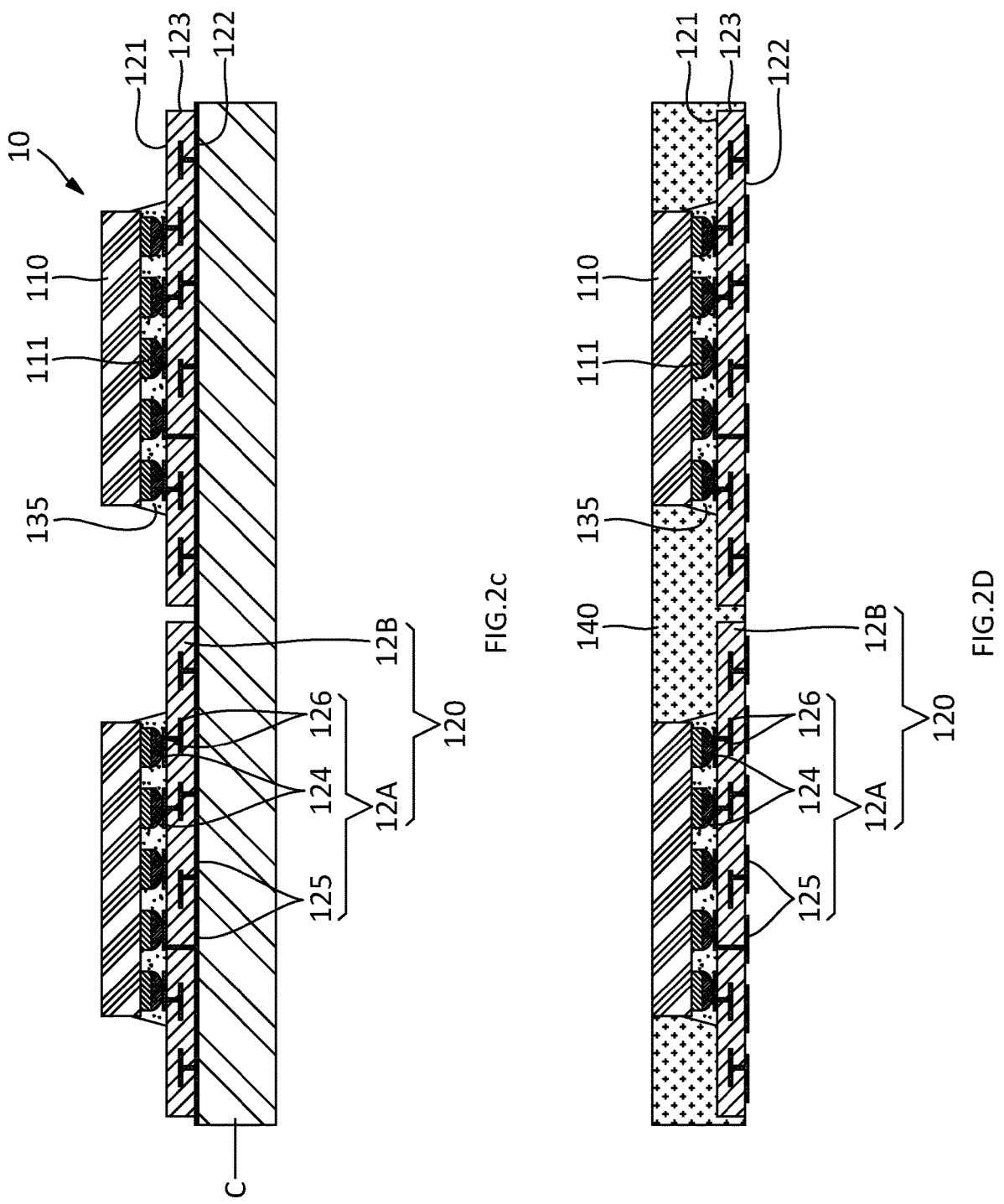

FIG. 2C shows a cross-sectional view of electronic devices 100 and 100A at a later stage of manufacture. In the example shown in FIG. 2C, electronic component unit 10 can be provided on carrier C. In electronic component unit 10, outer surface 125 of substrate 120 can be attached on the surface of carrier C. In some examples, electronic component units 10 can be disposed on the surface of carrier C to be spaced apart from each other in a row direction or a column direction. Since electronic devices 100 and 100A can have increased defects occurring on a substrate as the size of substrate 120 increases, in some examples a defect rate can be reduced by using only known-good electronic component units 10 pre-singulated as individual units.

Carrier C can be substantially a planar plate. In some examples, carrier C can comprise or be referred to as a wafer, board, panel, or strip. In some examples, carrier C can comprise silicon, glass, metal, or an organic material. The thickness of carrier C can range from approximately 50 millimeters (μm) to 8 mm, and the width of carrier C can range from approximately 100 mm to 1000 mm. Carrier C can serve to integrally handle electronic component units 10 before encapsulation 140 is formed.

Electronic component unit 10 can be attached to the surface of carrier C by a temporary adhesive layer on the surface of carrier C. The temporary adhesive layer can applied to the surface of carrier C by: a coating method such as spin coating, doctor blade, casting, painting, spray coating, slot die coating, curtain coating, slide coating, or knife over edge coating; a printing method, such as screen printing, pad printing, gravure printing, flexographic printing, or offset printing; an inkjet printing method such as a technology intermediate between coating and printing; or direct attachment of an adhesive film or an adhesive tape. The temporary adhesive layer can comprise or be referred to as a temporary adhesive film, a temporary adhesive tape, or a temporary adhesive coating. The temporary adhesive layer can be a heat release tape (film) or a light release tape (film), where the adhesive strength is weakened or removed by heat or light. In some examples, the adhesive strength of the temporary adhesive layer can be weakened or removed by physical or chemical external force.

FIG. 2D shows a cross-sectional view of electronic devices 100 and 100A at a later stage of manufacture. In the example shown in FIG. 2D, encapsulant 140 can be provided to cover electronic component 110, substrate 120, and carrier C. In some examples, encapsulant 140 can be in contact with substrate inner side 121 and substrate lateral sides 123, and lateral sides of electronic component 110.

In some examples, the upper side of electronic component 110 can be exposed at an upper side of encapsulant 140. In some examples, encapsulant 140 can comprise or be referred to as a body or a molding. For example, encapsulant 140 can comprise an epoxy mold compound, a resin, an organic polymer with inorganic filler, a curing agent, a catalyst, a coupling agent, a colorant, or a flame retardant, and can be formed by compression molding, transfer molding, liquid body molding, vacuum lamination, paste printing, or film assisted molding. Encapsulant 140 can be provided to cover substrate inner surface 121 and substrate lateral side 123, the upper and lateral sides of electronic component 110, and the upper side of carrier C. In some examples, the upper portion of encapsulant 140 can then be removed, such as by grinding, to expose the upper side of electronic component 110. With the upper side of electronic component 110 exposed, heat dissipation of electronic component 110 can be facilitated, and the sizes of electronic devices 100 and 100A can be reduced.

In some examples encapsulant 140 can be thinned by a conventional grinding or chemical etching process. In some examples, the thickness of encapsulant 140 can range from approximately 80 μm to 1000 μm. Encapsulant 140 can protect electronic component 110 and substrate 120 from external elements and can provide structural integrity to substrate 120 or electronic device 10.

After encapsulant 140 is formed, carrier C can be separated from substrate outer side 122 and the lower side of encapsulant 140. The temporary adhesive layer can be separated from substrate 120 and encapsulant 140 while being attached to carrier C. In some examples, heat, light, a chemical solution, or a physical external force can be provided to remove or reduce the adhesion of the temporary adhesive layer of carrier C, and thus carrier C can be separated from substrate 120 and encapsulant 140. Accordingly, substrate outer side 122 and the lower side of encapsulant 140 can be exposed. External terminal 124 of substrate 120 can also be exposed. In some examples, carrier C can be removed after encapsulant 140 is formed and before the upper portion of encapsulant 140 is removed.

Figures 2E, 2F:
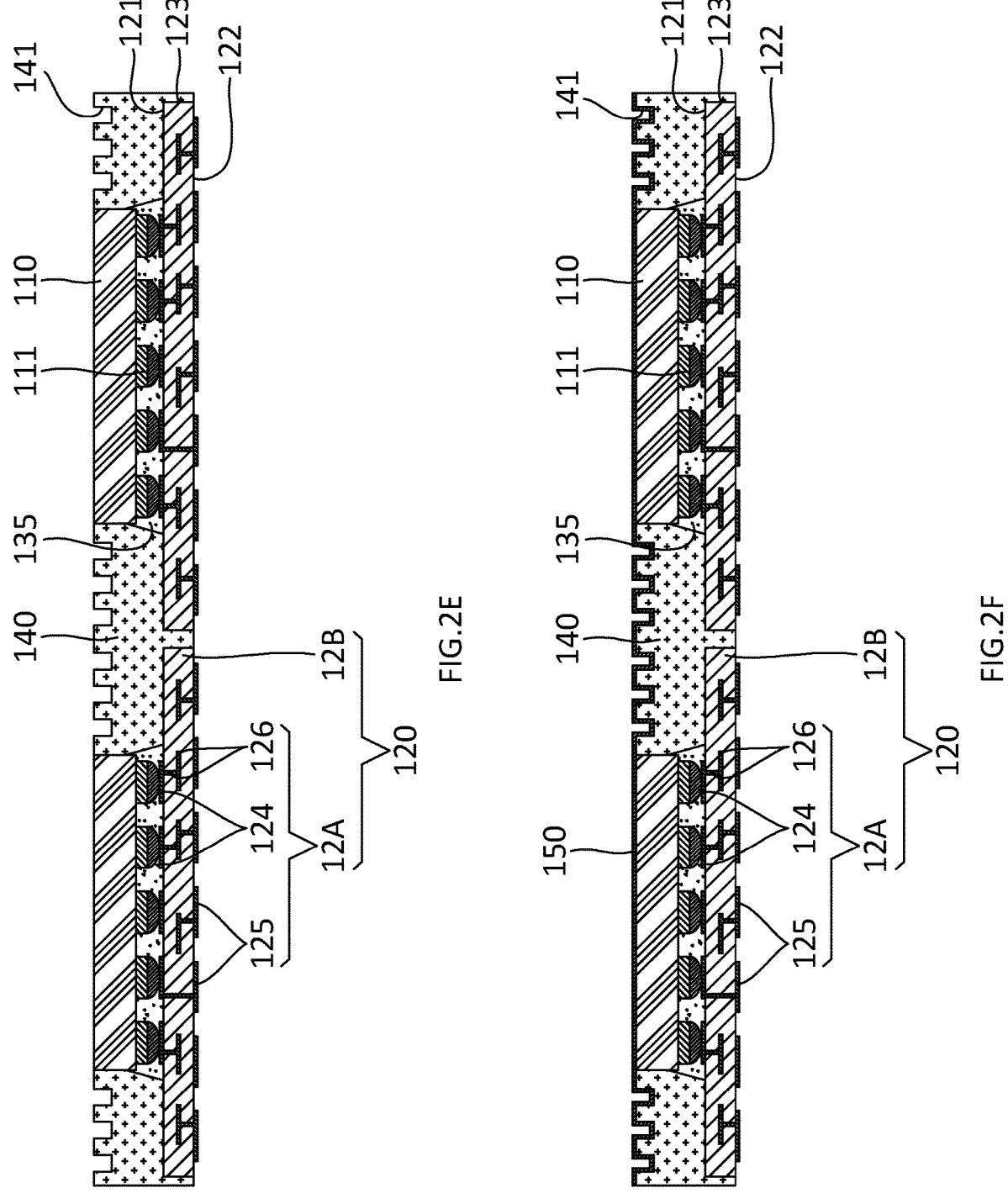

FIG. 2E shows a cross-sectional view of electronic devices 100 and 100A at a later stage of manufacture. In the example shown in FIG. 2E, trench 141 can be provided by removing material from the upper side of encapsulant 140. One or more trenches 141 can be provided on the upper side of encapsulant 140 in a row direction or a column direction and spaced apart from electronic component 110. For example, one or more trenches 141 can be provided spaced apart from each of the four lateral sides of electronic component 110. Trenches 141 can be spaced apart from, and parallel to or substantially parallel to the lateral sides of electronic component 110. Trench 141 can be positioned on substrate 110 in encapsulant 130. In some examples, trench 141 can be formed by removing a portion of the upper side of encapsulant 140 by a diamond wheel, a laser beam, or an etching method. In some examples, the depth of trench 141 can range from approximately 5 μm to 400 μm, or the width can range from approximately 10 μm to 300 μm.

FIG. 2F shows a cross-sectional view of electronic devices 100 and 100A at a later stage of manufacture. In the example shown in FIG. 2F, metallization layer 150 can be provided to cover the upper side of encapsulant 140 and the inner wall and base of trench 141. Metallization layer 150 can contact the upper side of encapsulant 140 and the inner wall and base of trench 141 with a substantially uniform thickness. In some examples, metallization layer 150 can contact the top side of electronic components 110. In some examples, metallization layer 150 can completely cover the top side of encapsulant 140 or 140A. Metallization layer 150 can comprise one or more metal layers. In some examples, metallization layer 150 can comprise a first metal layer coupled to encapsulant 140 and made of an insulating material, and a second metal layer that covers the surface of the first metal layer to prevent oxidation of the first metal layer. In some examples, for example, the first metal layer can be made of titanium (Ti) or chromium (Cr), or the second metal layer can be made of gold (Au). In some examples, metallization layer 150 can comprise or be referred to as a backside metallization. In some examples, metallization layer 150 can be provided with a substantially uniform thickness through sputtering or plating. For example, metallization layer 150 can have a thickness smaller than the depth or width of trench 141 and can conform to the shape of trench 141. In some examples, the thickness of metallization layer 150 can range from approximately 0.05 μm to 10 μm.

Figure 2G:
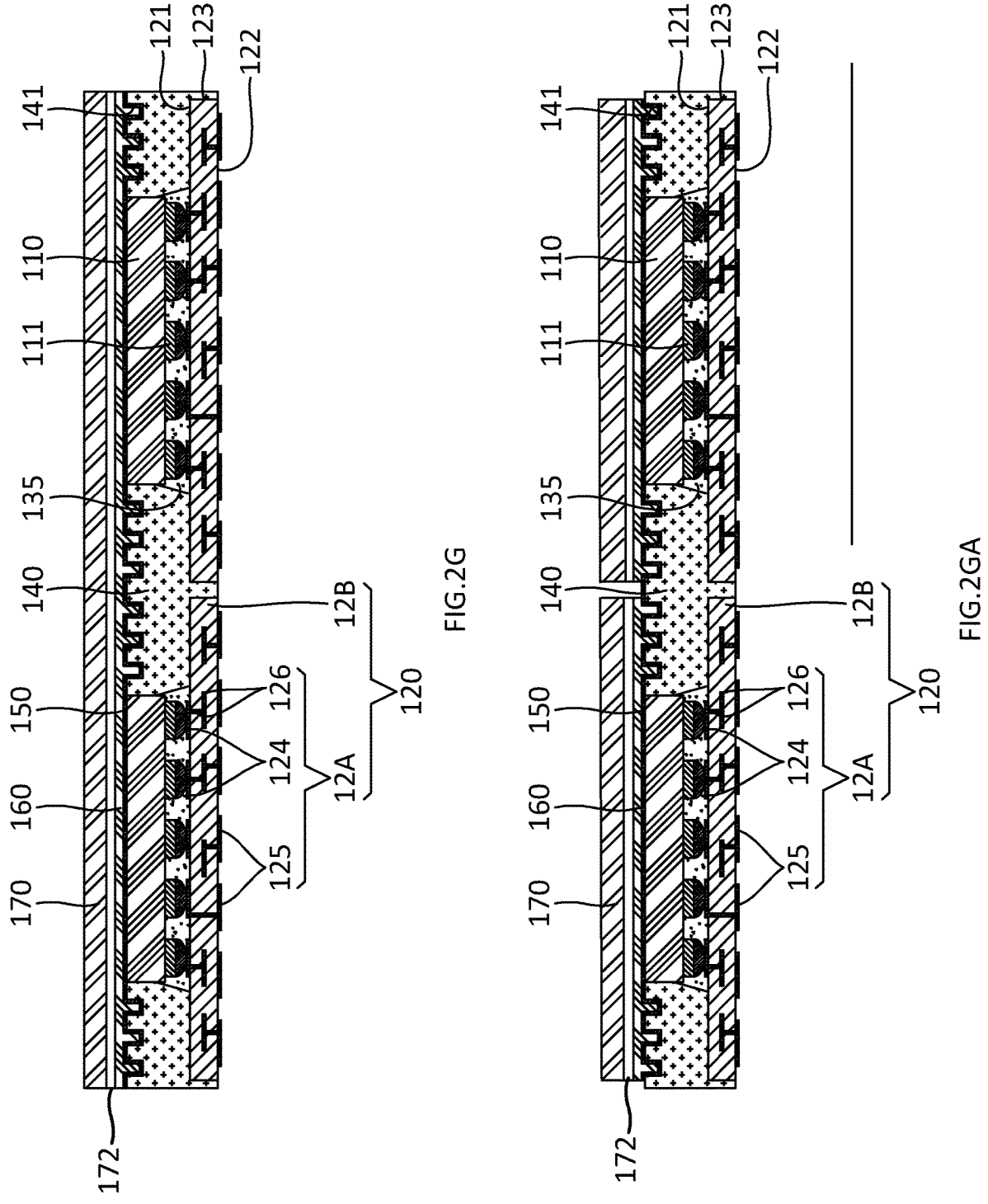

FIGS. 2G and 2GA show cross-sectional views of electronic devices 100 and 100A at a later stage of manufacture. In the example shown in FIGS. 2G and 2GA, metallic interface 160 and lid 170 can be provided to cover the surface of metallization layer 150. Metallic interface 160 can be in the form of a film having a substantially constant thickness when provided and can be seated on metallization layer 150. Lid 170 can be seated on metallic interface 160. In some examples, metallic interface 160 and lid 170 can be provided to completely cover the surface of metallization layer 150, as shown in FIG. 2G. In some examples, metallic interface 160 and lid 170 can be individually provided or separated, as shown in FIG. 2GA, and can be seated on the surface of metallization layer 150 for each respective electronic device. In some examples, after metallic interface 160 and lid 170 are provided on the surface of metallization layer 150, metallic interface 160 can be melted by heat treatment to completely fill the inside of trench 141 where metallization layer 150 is provided. Metallic interface 160 can be melted and cured to bond metallization layer 150 and lid 170 to each other. In some examples, metallization layer 150 can be interposed between metallic interface 160 and encapsulant 140 to aid in the adhesion of metallic interface 160 over the insulating material of encapsulant 140. Metallization layer 150 can be provided on encapsulant 140 or 140A prior to providing metallic interface 160 wherein the metallization layer 150 is between the top side of encapsulant 140 or 140A and metallic interface 160.

In some examples, metallic interface 160 can comprise or be referred to as a metallic thermal interface material (TIM). For example, metallic interface 160 can comprise a thermally conductive material such as solder or solder paste. Examples of such thermal interface materials include metal alloy materials, such as gallium, gallium alloys (e.g., alloys with indium, tin, and zinc), silver alloys, tin-silver, indium, or indium alloys. Since metallic interface 160 includes a thermally conductive material, heat generated from electronic component 110 can be more efficiently transferred to lid 170. Since metallic interface 160 fills the inside of trench 141, contact area is increased, and the bonding force between each of metallic interface 160 and metallization layer 150 and encapsulant 140 is increased. In some examples, the thickness of metallic interface 160 can range from approximately 1 μm to 250 μm.

Lid 170 can be a planar plate made of a metal with high heat conduction and radiation. In some examples, lid 170 can comprise a material such as aluminum, copper, or stainless steel. In some examples, lid 170 can comprise or be referred to as a heat sink or can comprise a heat sink, a heat dissipation plate, or a cover. In some examples, lid 170 can efficiently dissipate heat generated by electronic component 110. In some examples, the thickness of lid 170 can range from approximately 0.4 mm to 4 mm. In some examples, an additional metallization layer can be interposed between lid 170 and metallic interface 160 to increase adhesion therebetween. The additional metallization layer can comprise corresponding elements, features, materials, or manufacturing methods similar to previously described herein for metallization layer 150. In some examples, lid 170 optionally can include a backside metallization 172. In such examples, backside metallization 172 can provide enhanced wetting with metallic interface 160 and can comprise a metal such as gold (Au) or a similar material. In some examples, lid 170 can be pre-formed or pre-fabricated with backside metallization 172. It should be noted that that backside metallization 172 is optional wherein lid 170 can also be free of any backside metallization 172, and the scope of the disclosed subject matter is not limited in this respect.

Figure 2H:
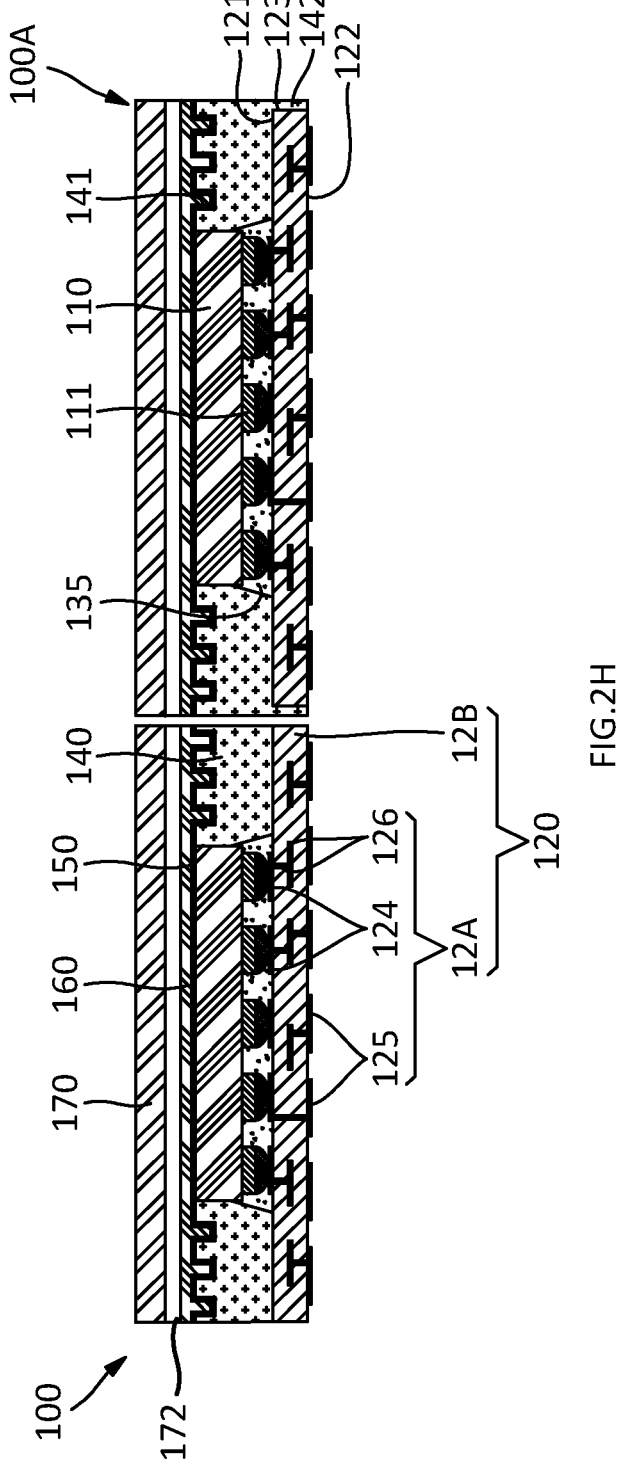

FIG. 2H shows a cross-sectional view of electronic devices 100 and 100A at a later stage of manufacture. In the example shown in FIG. 2H, a singulation process can be performed where metallization layer 150 and encapsulant

140 are cut to separate individual electronic devices 100 and 100A. In some examples, if metallic interface 160 and lid 170 completely cover the surface of metallization layer 150, metallic interface 160, lid 170, and backside metallization 172 can also be cut together with metallization layer 150 and encapsulant 140 during the singulation process.

In some examples, during the singulation process, a diamond blade or a laser beam can be used. In some examples, in electronic device 100, substrate lateral sides 123 and the lateral sides of encapsulant 140 can be coplanar. In some examples, skirt 142 of encapsulant 140A can cover substrate lateral sides 123 of electronic device 100A. The lower side of skirt 142 and substrate outer side 122 of the substrate 120 can be coplanar. In some examples, in electronic device 100A, skirt 142 of encapsulant 140A can cover a portion of the upper portion of substrate lateral sides 123, and the lower side of skirt 142 can be located above substrate outer side 122 of substrate 120.

In some examples, before metallic interface 160 and lid 170 are provided, a singulation process for sawing encapsulant 140 can first be performed. In electronic devices 100 and 100A, outward terminals 125 of the substrate 120 can be referred to as external input/output terminals.

Figures 3A, 3B:
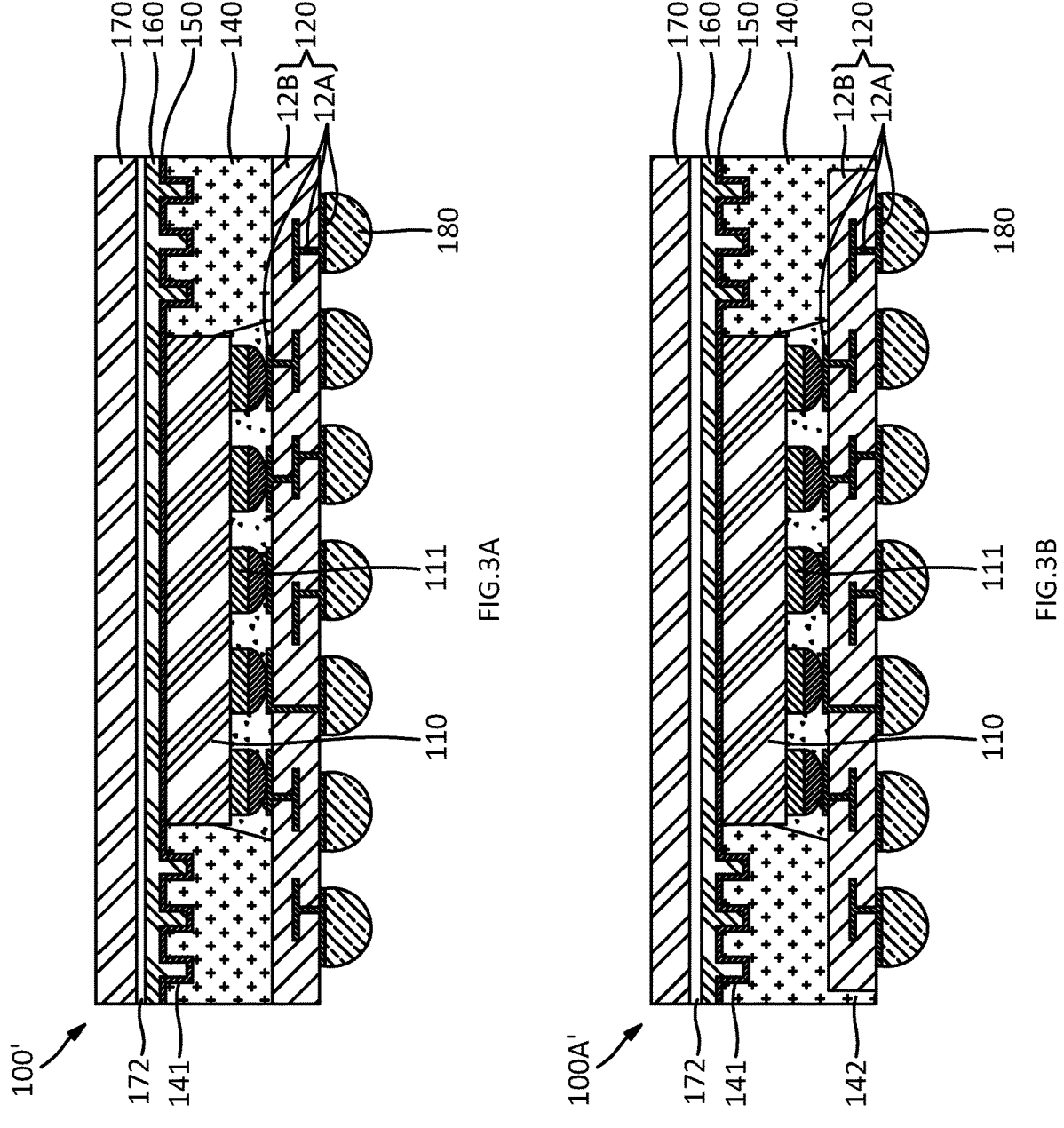
FIGS. 3A and 3B show cross-sectional views of an example electronic device.

FIGS. 3A and 3B show a cross-sectional views of example electronic devices 100' and 100A'. In the example shown in FIGS. 3 and 3B, electronic devices 100' and 100A' can comprise electronic component 110, substrate 120, encapsulants 140 and 140A, metallization layer 150, metallic Interface 160, lid 170 and external terminals 180. As shown in FIGS. 3A and 3B, in some examples lid 170 optionally can include a backside metallization 172. In such examples, backside metallization 172 can provide enhanced wetting with metallic interface 160 and can comprise a metal such as gold (Au) or a similar material. In some examples, lid 170 can be pre-formed or pre-fabricated with backside metallization 172. It should be noted that that backside metallization 172 is optional wherein lid 170 can also be free of any backside metallization 172, and the scope of the disclosed subject matter is not limited in this respect.

Electronic devices 100' and 100A' can include corresponding elements, features, materials, or methods of manufacturing similar to previously described for electronic devices 100 and 100A. Electronic devices 100' and 100A' can comprise external terminals 180.

External terminals 180 can be coupled to outward terminals 125 of substrate 120. External terminals 180 can be coupled to electronic component 110 through conductive structure 12A of substrate 120. In some examples, external terminals 180 can comprise or be referred to as pillars, solder tips, bumps, or solder balls. In some examples, external terminals 180 can comprise tin (NS), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external terminals 180 can be formed through a reflow process after forming a conductive material including solder on the lower side of outward terminal 125 of substrate 120 through a ball drop method. External terminals 180 can comprise or be referred to as conductive balls, such as solder balls, conductive pillars, such as copper pillars, or conductive posts where solder caps are provided on copper pillars. In some examples, the height of external terminals 180 can range from approximately 100 μm to 1200 μm. In some examples, external terminals 180 can be referred to as external input/output terminals of electronic devices 100' and 100A'. In some examples, the views shown by FIG. 3A and FIG. 3B for electronic devices 100' or 100A' can be subsequent or finalized views of electronic devices 100 or 100A of FIG. 1A or FIG. 1B, or of FIG. 2H.

Figures 4A, 4B:
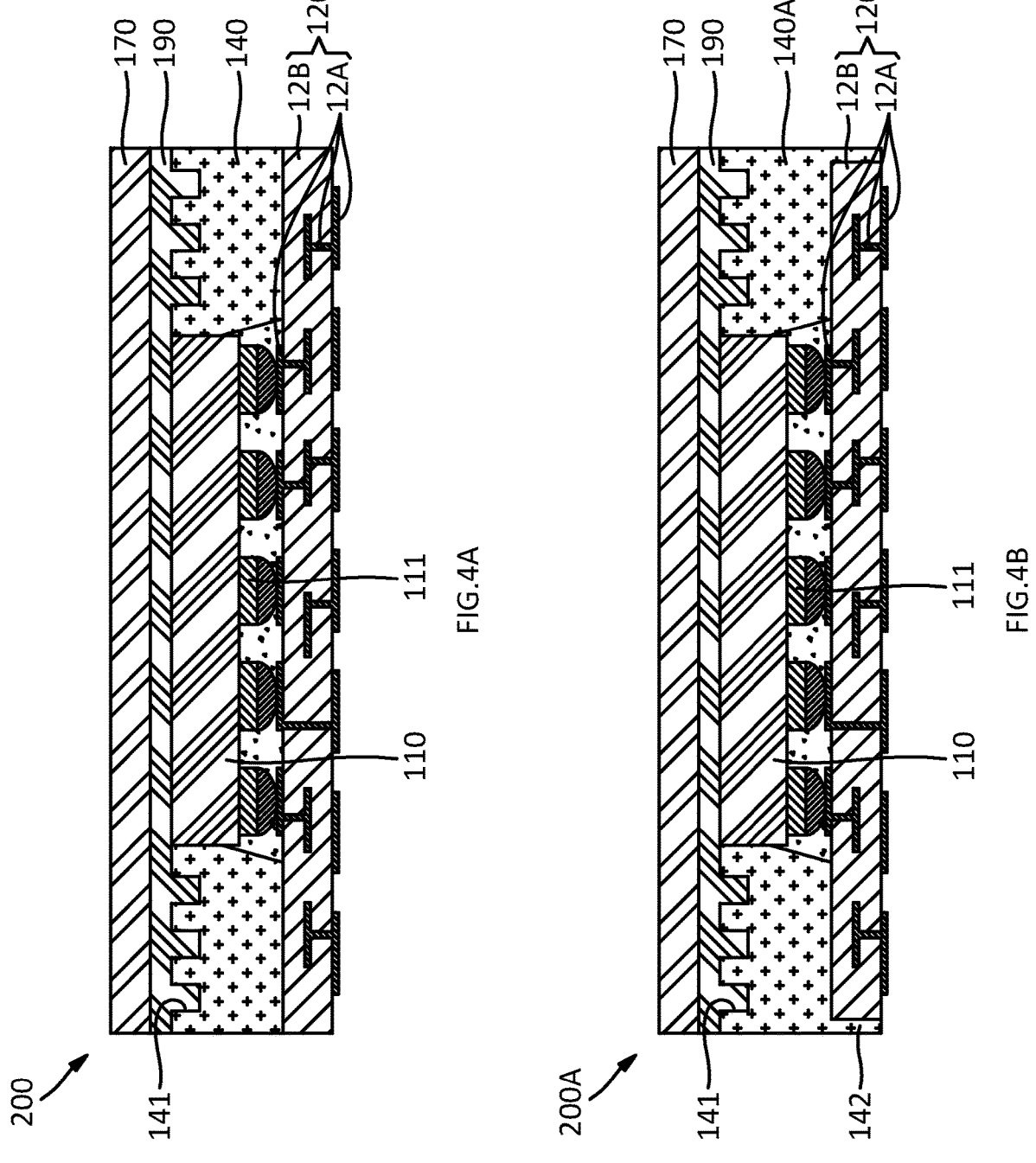
FIGS. 4A and 4B show cross-sectional views of an example electronic device.

FIGS. 4A and 4B show a cross-sectional views of example electronic devices 200 and 200A. In the example shown in FIGS. 4 and 4B, electronic devices 200 and 200A can comprise electronic component 110, substrate 120, encapsulants 140 and 140A, polymer interface 190, and lid 170.

Electronic devices 200 and 200A can include corresponding elements, features, materials, or methods of manufacturing similar to previously described for electronic devices 100 and 100A. Electronic devices 200 and 200A can comprise polymer interface 190.

Figures 5A, 5B:
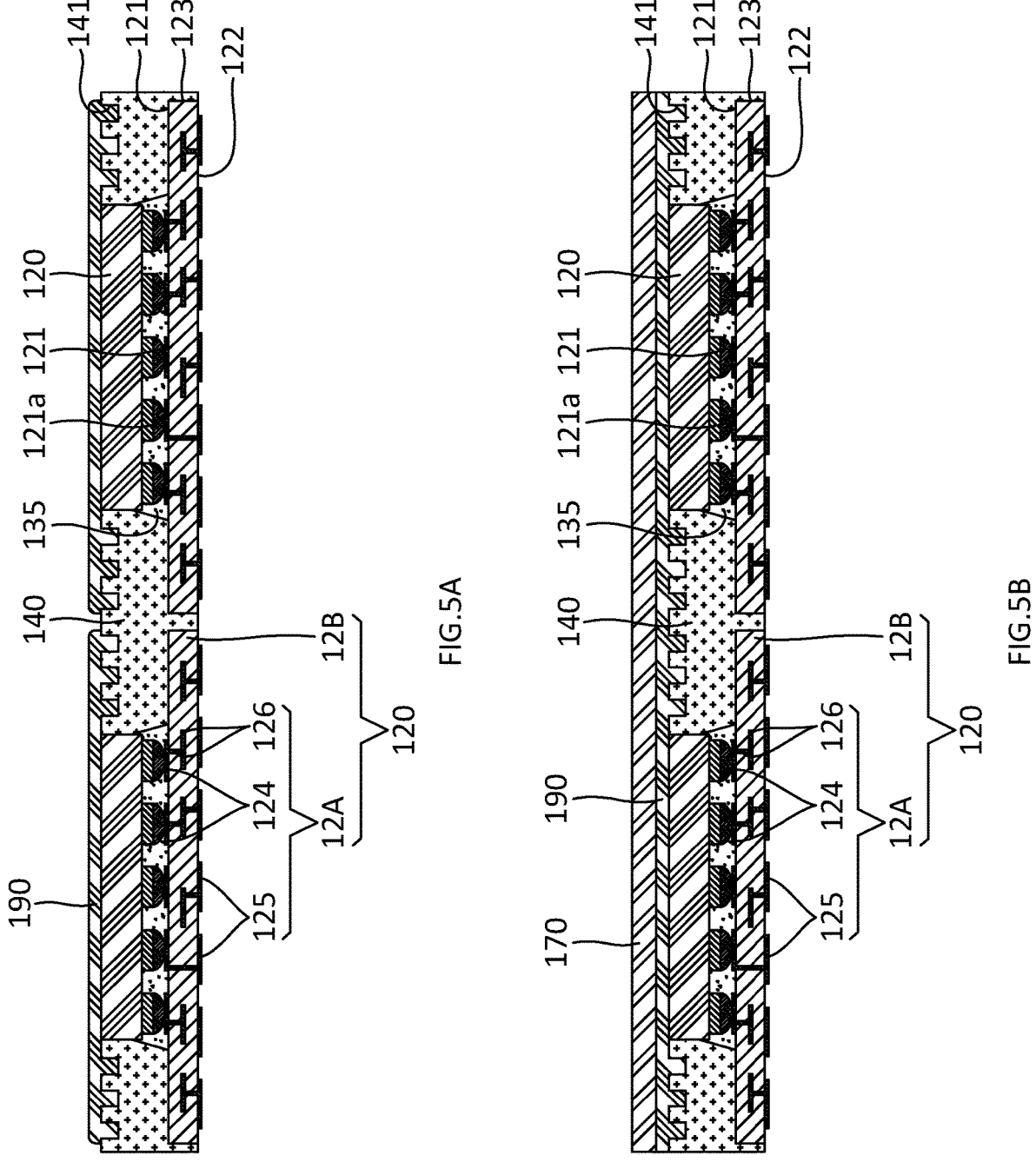
FIGS. 5A to 5C show cross-sectional views of an example method for manufacturing an example electronic device.
Figures 5B, 5C:
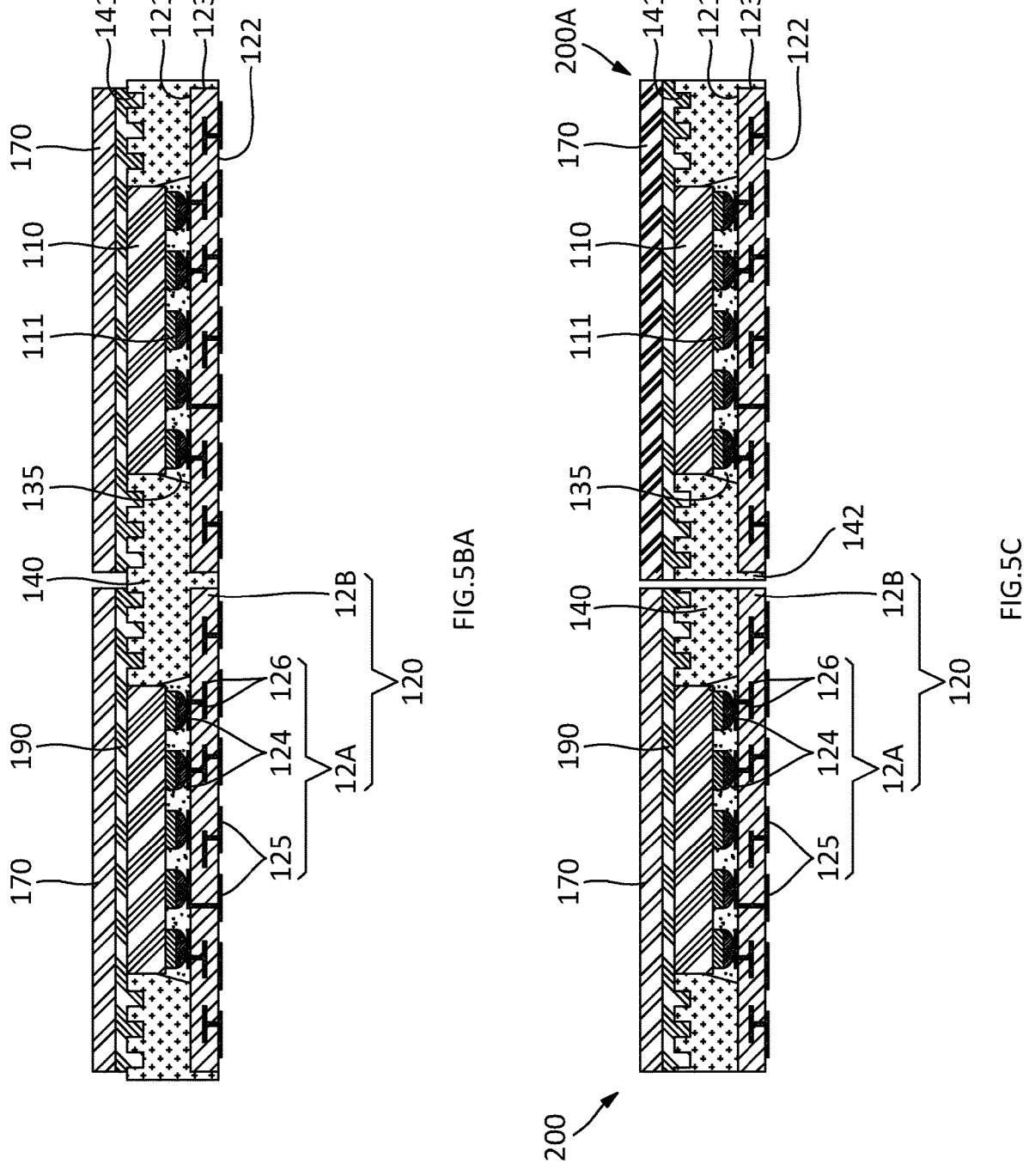

FIGS. 5A to 5C show cross-sectional views of an example method for manufacturing example electronic devices 200 and 200A. FIG. 5A shows a cross-sectional view of electronic devices 200 and 200A at an early stage of manufacture. In the example shown in FIG. 5A, the steps described with respect to FIGS. 2A to 2E can be followed, and then polymer interface 190 can be provided.

In some examples, polymer interface 190 can be dispensed on the surface of encapsulant 140 for each electronic device in a liquid or gel state. Polymer interface 190 can cover the upper side of encapsulant 140 and can fill trench 141. In some examples, polymer interface 190 can cover the entire surface of encapsulant 140. Examples of such polymer interface 190 include polymer type thermal interface materials, such as silicone, epoxy, or urethane, with highly thermal conductive fillers such as graphite, boron nitride, silver, aluminum, or aluminum oxide. Since polymer interface 190 includes a thermally conductive material, heat generated from electronic component 110 can be efficiently transferred to lid 170.

Since polymer interface 190 fills the inside of the trench 141, contact area with encapsulant 140 can be increased to increase bonding strength. In some examples, the thickness of polymer interface 190 can range from approximately 1 μm to 150 μm.

FIGS. 5B and 5BA show cross-sectional views of electronic devices 200 and 200A at a later stage of manufacture. In the example shown in FIGS. 5B and 5BA, lid 170 can be provided to cover the surface of the polymer interface 190. In some examples, as shown in FIG. 5B, lid 170 can completely cover the surface of polymer interface 190. In some examples, as shown in FIG. 5BA, polymer interface 190 can be individually separated and can be respectively seated on the surface of polymer interface 190 for each electronic device. After lid 170 is provided on the surface of polymer interface 190, polymer interface 190 can be cured to bond encapsulant 140 and lid 170.

FIG. 5C shows a cross-sectional view of electronic devices 200 and 200A at a later stage of manufacture. In the example shown in FIG. 5C, a singulation process defining individual electronic devices 200 and 200A by cutting through encapsulant 140 can be performed. In some examples, if polymer interface 190 and lid 170 completely cover the surface of encapsulant 140, polymer interface 190 and lid 170 can also be cut together with encapsulant 140 during the singulation process. In some examples, the singulation process can be similar to the singulation process shown in FIG. 2H.

In some examples, in electronic device 200, the lateral sides of substrate 123 and the lateral side of encapsulant 140 can be coplanar. In some examples, in electronic device 200A, skirt 142 of encapsulant 140A can cover substrate lateral sides 123. In some examples, before polymer interface 190 and lid 170 are provided, a singulation process for cutting encapsulant 140 can first be performed. In electronic devices 200 and 200A, outward terminals 125 of substrate 120 can be referred to as external input/output terminals.

Figures 6A, 6B:
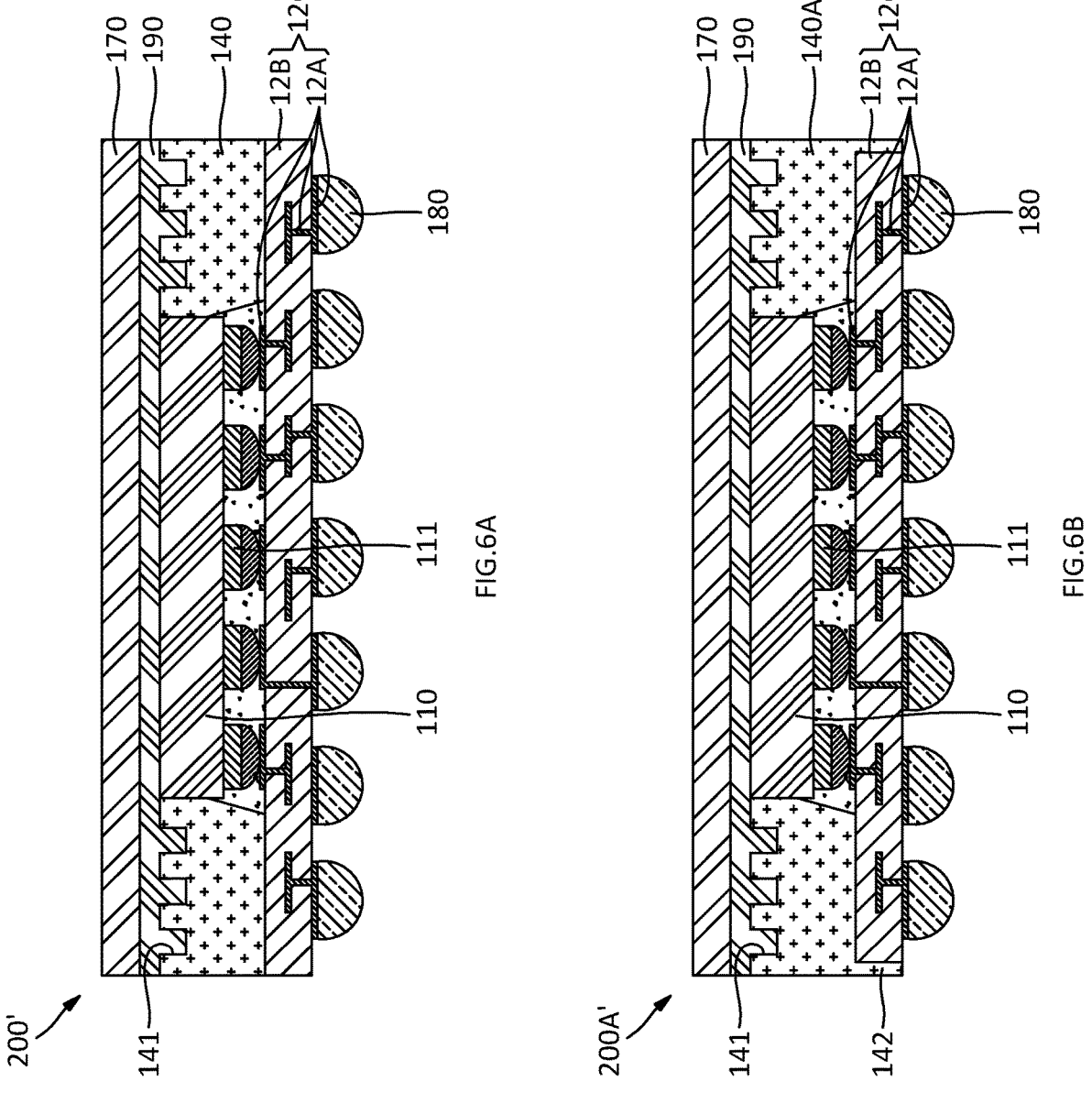
FIGS. 6A and 6B show a cross-sectional views of an example electronic device.

FIGS. 6A and 6B show a cross-sectional views of example electronic devices 200' and 200A'. In the example shown in FIGS. 6 and 6B, electronic devices 200' and 200A' can comprise electronic component 110, substrate 120, encapsulants 140 and 140A, polymer interface 190, lid 170, and external terminals 180.

Electronic devices 200' and 200A' can include corresponding elements, features, materials or methods of manufacturing similar to previously described for electronic devices 200 and 200A. Electronic devices 200' and 200A' can comprise external terminals 180. External terminals 180 can include corresponding elements, features, materials, or methods of manufacturing as previously described herein for external terminals 180 of electronic devices 100' and 100A'. In some examples, the views shown by FIGS. 6A and 6B for electronic devices 200' or 200A' can be subsequent or finalized views of electronic devices 200 or 200A of FIG. 4A or FIG. 4B, or of FIG. 5C.

The present disclosure includes reference to certain examples. It will be understood by those skilled in the art, however, that various changes may be made, and equivalents may be substituted without departing from the scope of the disclosure. In addition, modifications can be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:
a substrate comprising a dielectric structure and a conductive structure, and a top side and a bottom side;
an electronic component over the top side of the substrate, wherein the electronic component is coupled with the conductive structure;
an encapsulant over the top side of the substrate and surrounding the electronic component, wherein the encapsulant comprises a first trench on a top side of the encapsulant adjacent to the electronic component;
a lid over the top side of the encapsulant and covering the electronic component; and
an interface material between the top side of the encapsulant and the lid, and in the first trench;
wherein the top side of the encapsulant is coplanar with a top side of the electronic component.

2. The electronic device of claim 1, wherein the interface material comprises a metallic interface.

3. The electronic device of claim 2, further comprising a metallization layer between the top side of the encapsulant and the metallic interface, and in the first trench;
wherein the metallization layer contacts a majority of the top side of the electronic component.

4. The electronic device of claim 2, wherein the metallic interface comprises a thermal interface material (TIM).

5. The electronic device of claim 1, wherein the interface material completely covers the top side of the encapsulant.

6. The electronic device of claim 1, further comprising:
a second trench in the top side of the encapsulant adjacent to the first trench;
wherein the interface material is in the second trench; and
wherein the first trench and the second trench are outside a footprint of the electronic component.

7. The electronic device of claim 1, wherein the interface material comprises a polymer interface, and wherein the polymer interface contacts a majority of the top side of the electronic component.

8. The electronic device of claim 7, wherein the polymer interface comprises a thermally conductive filler.

9. The electronic device of claim 1, wherein the substrate comprises a lateral side between the top side of the substrate and the bottom side of the substrate, and wherein the encapsulant comprises a skirt covering the lateral side of the substrate.

10. An electronic device, comprising:

a substrate comprising a dielectric structure and a conductive structure, and a top side and a bottom side;

an electronic component over the top side of the substrate, wherein the electronic component is coupled with the conductive structure;

an encapsulant over the top side of the substrate and surrounding the electronic component;

a lid over a top side of the encapsulant and covering the electronic component;

a metallic interface between the top side of the encapsulant and the lid; and a backside metallization layer between the top side of the encapsulant and the metallic interface, wherein the backside metallization layer contacts a majority of the top side of the electronic component;

wherein the substrate comprises a lateral side between the top side of the substrate and the bottom side of the substrate, and wherein the encapsulant comprises a skirt covering the lateral side of the substrate.

11. The electronic device of claim 10, wherein the metallic interface comprises a thermal interface material (TIM).

12. The electronic device of claim 10, wherein the metallic interface and the backside metallization layer completely cover the top side of the encapsulant.

13. The electronic device of claim 10, wherein:

the encapsulant comprises a trench on the top side of the encapsulant adjacent to the electronic component;

the metallic interface and the backside metallization layer are in the trench; and the trench is outside a footprint of the electronic component.

14. A method manufacturing an electronic device, comprising:

providing a substrate comprising a dielectric structure and a conductive structure, and a top side and a bottom side;

providing an electronic component over a top side of the substrate and coupled with the conductive structure;

providing an encapsulant over the top side of the substrate and surrounding the electronic component;

providing a trench on a top side of the encapsulant adjacent to the electronic component;

providing an interface material over the top side of the encapsulant and in the trench; and providing a lid over the top side of the encapsulant and covering the electronic component, wherein the interface material is between the top side of the encapsulant and the lid;

wherein the top side of the encapsulant is coplanar with a top side of the electronic component.

15. The method of claim 14, wherein:

the interface material comprises a metallic interface; and comprising providing a metallization layer between the top side of the encapsulant and the metallic interface, and in the trench, prior to providing the interface material.

16. The method of claim 15, wherein the metallic interface comprises a thermal interface material (TIM).

17. The method of claim 14, wherein the interface material comprises a polymer interface, and wherein the polymer interface contacts a majority of the top side of the electronic component.

18. The method of claim 14, wherein the substrate comprises a lateral side between the top side of the substrate and the bottom side of the substrate, and wherein the encapsulant comprises a skirt covering the lateral side of the substrate.

* * * * *